United States Patent
Yoshida et al.

(10) Patent No.: US 7,301,399 B2
(45) Date of Patent: Nov. 27, 2007

(54) CLASS AB CMOS OUTPUT CIRCUIT EQUIPPED WITH CMOS CIRCUIT OPERATING BY PREDETERMINED OPERATING CURRENT

(75) Inventors: Takeshi Yoshida, Higashi-Hiroshima (JP); Atsushi Iwata, Higashi-Hiroshima (KR); Mamoru Sasaki, Higashi-Hiroshima (JP); Kunihiko Gotoh, Kawasaki (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 173 days.

(21) Appl. No.: 11/287,469

(22) Filed: Nov. 28, 2005

(65) Prior Publication Data

US 2006/0114061 A1 Jun. 1, 2006

(30) Foreign Application Priority Data

Nov. 26, 2004 (JP) ............................ P2004-342421

(51) Int. Cl.
*H03F 3/18* (2006.01)
(52) U.S. Cl. .................................................... 330/264
(58) Field of Classification Search ................. 330/264
See application file for complete search history.

(56) References Cited

U.S. PATENT DOCUMENTS 6,411,167 B2   6/2002   Laaser ........................ 330/264

6,603,356 B1 *  8/2003   Kim et al. ................... 330/265
7,078,971 B2 *  7/2006   Colbeck ...................... 330/255

FOREIGN PATENT DOCUMENTS

JP     2002-521950 A    7/2002

OTHER PUBLICATIONS

Matsuzawa, *CMOS Operational Amplifier*, The IEICE Transactions on Electronics (Electronics Society), published by the Institute of Electronics, Information and Communication Engineers (IEICE) in Japan, vol. J84-C, No. 5, pp. 357-373, May 2001; and partial English translation of same (2 pages).

* cited by examiner

*Primary Examiner*—Steven J. Mottola
(74) *Attorney, Agent, or Firm*—Nixon & Vanderhye, P.C.

(57) ABSTRACT

In a class AB CMOS output circuit provided with a CMOS circuit including first P and N channel transistors and operating by a predetermined operating current $I_o$, a replica circuit is formed on a semiconductor substrate of the CMOS circuit, and includes a second P channel transistor having a size equal or similar to that of the first P channel transistor, and a second N channel transistor having a size equal or similar to that of the first N channel transistor. A bias voltage supply allows the second P and N channel transistors to operate based on a reference current Iref corresponding to the operating current $I_o$, applies a first bias voltage as applied to the second P channel transistor to the first P channel transistor, and applies a second bias voltage as applied to the second N channel transistor to the first N channel transistor.

6 Claims, 2 Drawing Sheets

CLASS AB CMOS OUTPUT CIRCUIT EQUIPPED WITH CMOS CIRCUIT OPERATING BY PREDETERMINED OPERATING CURRENT

BACKGROUND OF THE INVENTION

1. Field of the Invention

The present invention relates to a class AB CMOS output circuit equipped with a CMOS circuit, and in particular, a class AB CMOS output circuit including a CMOS circuit which is formed on a semiconductor substrate and operates by a predetermined operating current.

2. Description of the Related Art

As an output circuit of a CMOS operational amplifier circuit, there have been known a source follower circuit and a class A output circuit. These circuits have such a problem as a narrow output dynamic range and increase in power consumption due to a relatively large stationary current. Therefore, a class AB output circuit, which can implement a relatively small stationary current and a relatively large output current in a wide output dynamic range, has been widely used currently as an output circuit of the CMOS operational amplifier circuit (for example, See FIG. 16 of a prior art document of Akira Matsuzawa, "CMOS Operational Amplifier", The IEICE Transactions on Electronics (Electronics Society), published by the Institute of Electronics, Information and Communication Engineers (IEICE) in Japan, Vol. J84-C, No. 5, pp. 357-373, May 2001 (referred to as a prior art document hereinafter).

In a paragraph "3.5 Output Buffer" of the prior art document, the following is disclosed. FIG. 16 of the prior art document is shown in FIG. 3 of the present application.

In order to drive a resistance load, it is necessary to provide a buffer circuit that buffers a high-impedance voltage. A simplest voltage buffer is a source-follower circuit. However, the source follower circuit has the following problems. A voltage shift of $V_{gs}$ is caused in the source follower circuit, and an output dynamic range is narrowed. Then it is difficult to use the same as a relatively low voltage circuit of about three volts, which has been recently considered as a standard. Further, a relatively large stationary current flows in the circuit to increase power consumption. For these reasons, a class AB buffer circuit having a relatively small stationary current and that can obtain substantially full-scale output voltage has been widely used instead.

FIG. 3 shows a class AB buffer circuit using common gate level shift. As shown in FIG. 3, it is considered to be easily understood that, in bias conditions in which a current $2I_b$ flows in a transistor M5 when a W/L ratio of each transistor is set, the voltages are set to satisfy V2=V3 and V1=V4 and a bias current $I_O$ flows in transistors M1 and M2. Next, when a voltage $V_{in}$ falls from the voltage of this bias state, the current flowing in the transistor M5 increases, and the voltages V1 and V2 rise. Accordingly, the transistor M4 is turned off, all the currents flows in a transistor M3, the voltage V1 rises so as to close to the voltage $V_{dd}$, the transistor M1 is turned off, a gate voltage of the transistor M2 rises so as to close to the voltage $V_{dd}$, and a leading-in current of the transistor M2 suddenly rises. Conversely, when the voltage $V_{in}$ rises from the voltage of the bias state, the transistors M3 and M2 are turned off, the voltage V1 falls to a voltage near a ground voltage, and a current of the transistor M1 suddenly rises. As can be seen from above, the class AB buffer circuit can withdraw a relatively large driving current for operation from the small bias current in the bias state, and also, can obtain a wide output dynamic range from a ground potential to the voltage $V_{dd}$. This circuit is employed by, for example, inserting the transistors M3 and M4 into an output-side current path of an amplifier circuit of one stage.

In a relatively low voltage circuit in which the power supply voltage $V_{dd}$ is, for example, one volt and in which a threshold voltage Vth of a P channel metal oxide semiconductor field effect transistor (referred to as a "MOSFET" hereinafter) or an N channel MOSFET is, for example, 0.5 volts, it is disadvantageously difficult to provide transistors of multiple stages in an operational amplifier circuit. Therefore, there is caused such a problem that it is impossible to implement any bias circuit of the class AB CMOS output circuit according to the prior art shown in FIG. 3.

SUMMARY OF THE INVENTION

It is an essential object of the present invention to provide a class AB CMOS output circuit capable of providing transistors of multiple stages in an operational amplifier circuit in a relatively low voltage circuit, and implementing a bias circuit of the class AB CMOS output circuit.

In order to achieve the aforementioned objective, according to one aspect of the present invention, there is provided a class AB CMOS output circuit provided with a CMOS circuit formed on a semiconductor substrate. The CMOS circuit includes a first P channel transistor and a first N channel transistor, and operates by a predetermined operating current $I_o$. The class AB CMOS output circuit further includes a replica circuit formed on the semiconductor substrate, and a bias voltage supply. The replica circuit includes a second P channel transistor having a size equal or similar to that of the first P channel transistor, and a second N channel transistor having a size equal or similar to that of the first N channel transistor. The bias voltage supply allows the second P channel transistor and the second N channel transistor of the replica circuit to operate based on a reference current Iref corresponding to the operating current $I_o$, applies a first bias voltage as applied to a gate of the second P channel transistor to a gate of the first P channel transistor, and applies a second bias voltage as applied to a gate of the second N channel transistor to a gate of the first N channel transistor.

The class AB CMOS output circuit preferably further includes a third P channel transistor for operation switching inserted between the first P channel transistor and a power supply voltage source Vdd, and a third N channel transistor for operation switching inserted between the first N channel transistor and a ground voltage Vss.

In addition, the class AB CMOS output circuit preferably further includes an operational amplifier circuit provided at a previous stage of the class AB CMOS output circuit.

Further, the class AB CMOS output circuit preferably further includes a level shifter circuit provided between the operational amplifier circuit and the class AB CMOS circuit.

Accordingly, the class AB CMOS output circuit according to the present invention can constitute the class AB CMOS output circuit that supplies bias voltages of the CMOS output circuit from the replica circuit. The present invention exhibits such unique function and advantageous effects that the class AB CMOS output circuit can be implemented even by a relatively low voltage circuit that cannot implement a bias circuit by providing transistors of multiple stages. In other words, the class AB CMOS output circuit according to the present invention operates at a relatively low power supply voltage of, for example, one volt or less, and it is possible to arbitrarily set the stationary current of the class AB CMOS output circuit from an external circuit.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

A preferred embodiment according to the present invention will be described hereinafter with reference to the drawings. It should be noted that components similar to each other are denoted by the same numerical references.

Figure 1:
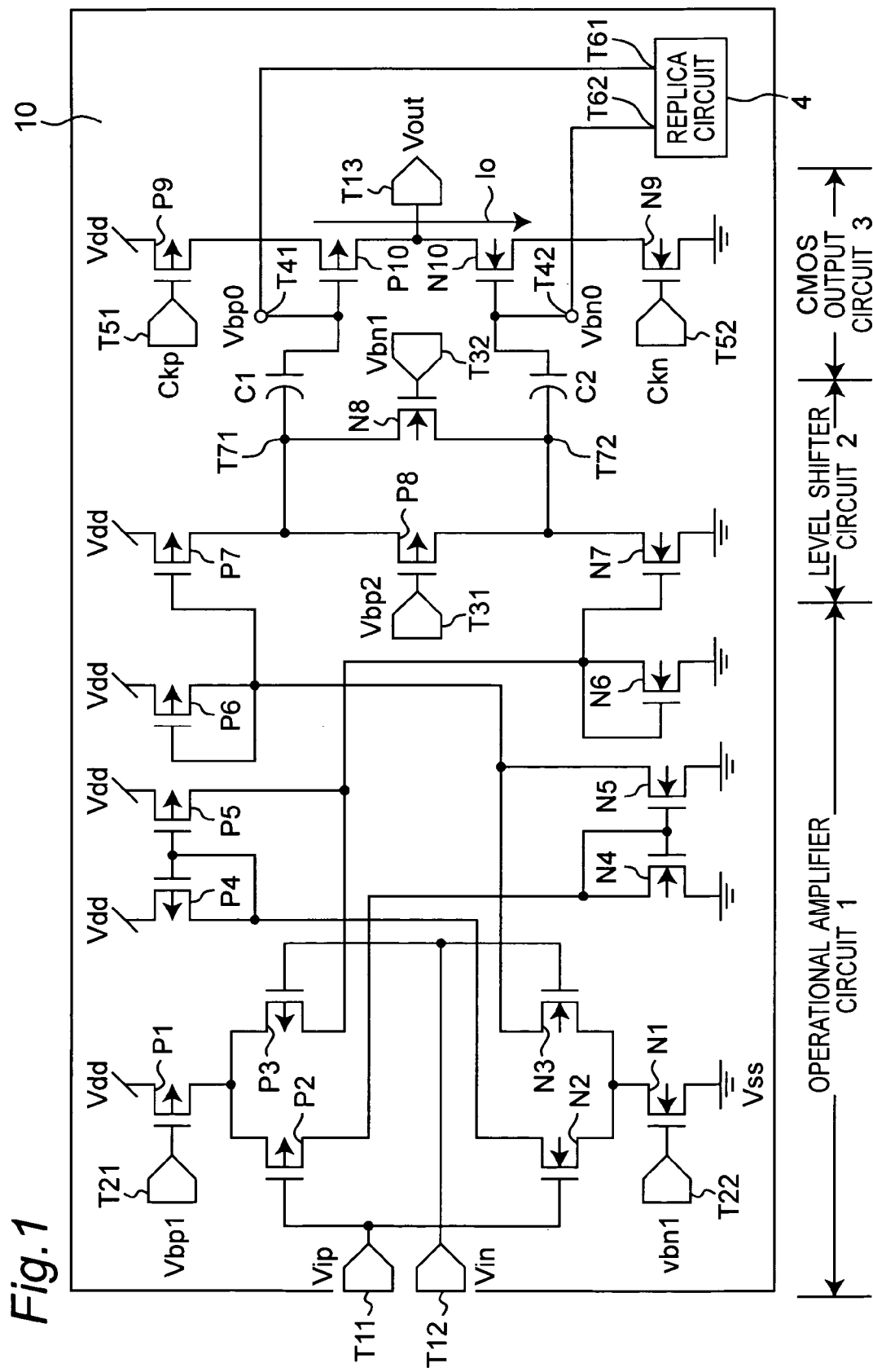
FIG. 1 is a circuit diagram showing a configuration of an amplifier circuit that includes a class AB CMOS output circuit 3 according to a preferred embodiment of the present invention.
Figure 2:
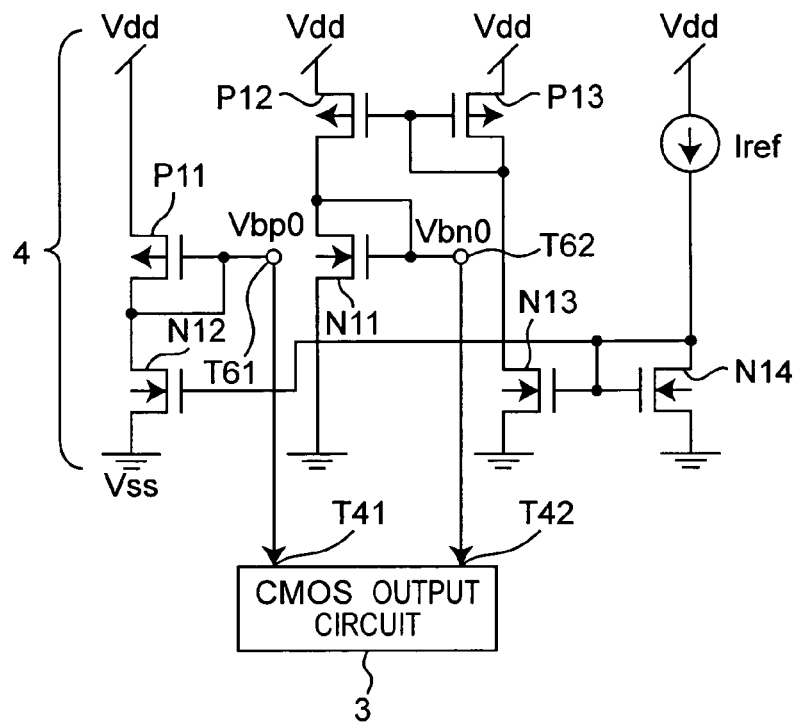
FIG. 2 is a circuit diagram showing a configuration of a replica circuit 4 shown in FIG. 1.
Figure 3:
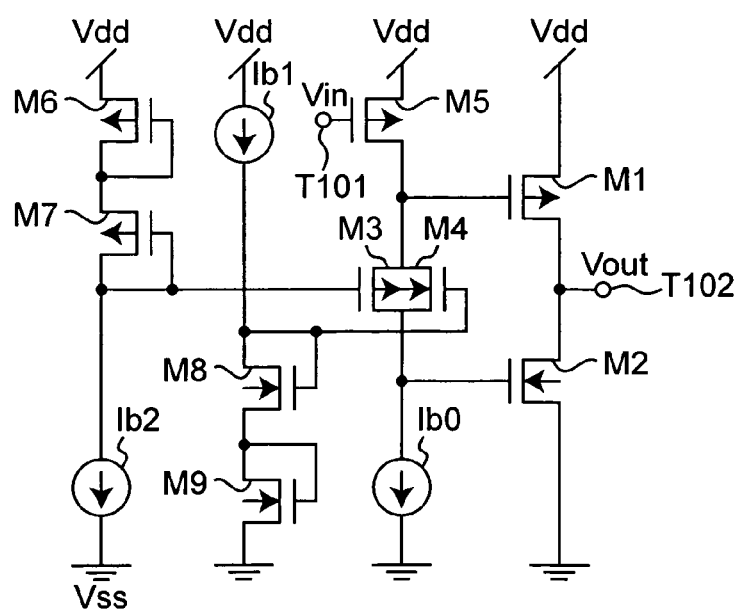
FIG. 3 is a circuit diagram showing a configuration of a class AB CMOS output circuit according to a prior art.

FIG. 1 is a circuit diagram showing a configuration of an amplifier circuit that includes a class AB CMOS output circuit 3 according to a preferred embodiment of the present invention. FIG. 2 is a circuit diagram showing a configuration of a replica circuit 4 that supplies bias voltages to the CMOS output circuit 3 of in FIG. 1.

As shown in FIG. 1, the amplifier circuit according to the present preferred embodiment is constituted so that an operational amplifier circuit 1, a level shifter circuit 2, the CMOS output circuit 3, and the replica circuit 4 are formed on the same semiconductor substrate 10. The amplifier circuit is characterized in that bias voltages Vbp0 and Vbn0 for the CMOS output circuit 3 are generated and supplied by the replica circuit 4 including MOSFETs each having a size substantially equal or similar to that of each MOSFETs of the CMOS output circuit 3.

Referring to FIG. 1, the operational amplifier circuit 1 is a well-known differential amplification type operational amplifier (fully differential operational amplifier) circuit of multiple stages that includes six P channel MOSFETs P1 to P6 and six N channel MOSFETs N1 to N6. The operational amplifier circuit 1 is formed by a CMOS circuit which is connected between a power supply voltage Vdd and a ground voltage Vss. Differential input signals Vip and Vin are respectively inputted to input terminals T11 and T12, and these signals Vip and Vin are respectively amplified by the operational amplifier circuit 1, and are outputted to the level shifter circuit 2. A bias voltage Vbp1 is applied to a bias input terminal T21 connected to a gate of the P channel MOSFET P1 of the first stage, and a bias voltage Vbn1 is applied to a bias input terminal T22 connected to a gate of the N channel MOSFET N1 of the first stage.

The level shifter circuit 2 includes two P channel MOSFETs P7 and P8 and two N channel MOSFETs N7 and N8. Changing of (a) a bias voltage Vbp2 applied to a bias input terminal T31 connected to a gate of the P channel MOSFET P8 and (b) a bias voltage Vbn0 applied to a bias voltage Vbn2 applied to a bias input terminal T32 connected to a gate of the N channel MOSFET N8 leads to shit in the levels of differential output voltage signals outputted from the operational amplifier circuit 1. Thereafter, the level-shifted differential output voltage signals are outputted to the CMOS output circuit C3 via coupling capacitors C1 and C2 for separating the bias voltages. In the level shifter circuit 2, the power supply voltage source Vdd is connected to a terminal T71 via a source and a drain of the P channel MOSFET P7, and the terminal T71 is connected to a terminal T72 via a source and a drain of the P channel MOSFET P8. The terminal T72 is grounded via a drain and a source of the N channel MOSFET N7. The terminal T71 is connected to the terminal T72 via a drain and a source of the N channel MOSFET N8.

The CMOS output circuit 3 includes two P channel MOSFETs P9 and P10 and two N channel MOSFETs N9 and N10. The power supply voltage source Vdd is connected to a source of the P channel MOSFET P10 via a source and a drain of the P channel MOSFET P9, and the source of the P channel MOSFET P10 is connected to an output terminal T13 via the drain thereof. The output terminal T13 is connected to a drain of the N channel MOSFET N9 via a drain and a source of the N channel MOSFET N10, and the drain of the N channel MOSFET N9 is grounded via the source thereof. An output-side terminal of the coupling capacitor C1 is connected to a bias input terminal T41 and a gate of the P channel MOSFET P10, and an output-side terminal of the coupling capacitor C2 is connected to a bias input terminal T42 and a gate of the N channel MOSFET N10. It is noted that predetermined bias voltages are applied to the bias input terminals T41 and T42 from the replica circuit 4, respectively, and this will be described later in detail.

In the amplifier circuit shown in FIG. 1, the bias voltages Vbp1 and Vbn1 are set to bias voltages at which the P channel MOSFET P1 and the N channel MOSFET N1 can operate as current sources, respectively. Concretely speaking, the bias voltages Vbp1 and Vbn1 are set as shown in the following Equations (1) and (2):

$$Vthn < Vbn1 < Vdd \qquad (1), \text{ and}$$

$$|Vthp| > Vbn1 > Vss \qquad (2),$$

where Vdd denotes a voltage of the power supply voltage source and Vss denotes the ground voltage. In addition, Vthn denotes a threshold voltage of the N channel MOSFET N1, and Vthp denotes a threshold voltage of the P channel MOSFET P1. Each of the bias voltages Vbp2 and Vbn2 is set so that an operating current $I_O$ flows in an output balance in which the CMOS output circuit 3 operates as a class AB CMOS output circuit.

In the CMOS output circuit 3 constituted as stated above, a switching signal Ckp equal to or higher than the threshold voltage Vthp of the P channel MOSFET P9 is applied to a bias input terminal T51 connected to the gate of the P channel MOSFET P9 to turn off the P channel MOSFET P9. In addition, a switching signal Ckn equal to or lower than the threshold voltage Vthn of the N channel MOSFET N9 is applied to a bias input terminal T52 connected to the gate of the N channel MOSFET N9 to turn off the N channel MOSFET N9. In this case, the output terminal T13 connected to the drain of the P channel MOSFET P10 and that of the N channel MOSFET N10 is turned into a high-impedance state or a so-called open state. On the other hand, the switching signal Ckp lower than the threshold voltage Vthp of the P channel MOSFET P9 is applied to the bias input terminal T51 to turn on the P channel MOSFET P9. In addition, the switching signal Ckn equal to or higher than the threshold voltage Vthn of the N channel MOSFET N9 is applied to the bias input terminal T52 to turn on the N channel MOSFET N9. In this case, the operating current $I_o$ flows from the power supply voltage source Vdd to the P channel MOSFETs P9 and P10 and the N channel MOSFETs N10 and N9, and the differential input signals inputted via the coupling capacitors C1 and C2 are outputted from the output terminal T13 via the CMOS output circuit 3.

The replica circuit 4 of FIG. 2 includes three P channel MOSFETs P11 to P13, four N channel MOSFETs N11 to N14, and a reference current source Iref, and is formed on the same semiconductor substrate 10, on which the amplifier circuit of FIG. 1 is formed.

Referring to FIG. 2, the power supply voltage source Vdd is connected to a drain of the N channel MOSFET N12 via a source and a drain of the P channel MOSFET P11, and a source of the N channel MOSFET N12 is grounded. The drain of the P channel MOSFET P11 is connected to the gate thereof, and also connected to a bias output terminal T61 connected to the bias input terminal T41 of the CMOS output circuit 3. A gate of the N channel MOSFET N12 is connected to a gate and a drain of the N channel MOSFET N14 and to a gate of the N channel MOSFET N13.

Further, the power supply voltage source Vdd is connected to the drain and the gate of the N channel MOSFET N12 via a source and a drain of the P channel MOSFET P12, and to a bias output terminal P62 connected to the bias input terminal T42 of the CMOS output circuit 3. The source of the N channel MOSFET N12 is grounded. A gate of the P channel MOSFET P12 is connected to a gate and a drain of the P channel MOSFET P13, and is grounded via the drain and a source of the N channel MOSFET N13. Besides, the power supply voltage source Vdd is grounded via the reference current source Iref and a drain and a source of the N channel MOSFET N14.

In the replica circuit 4 of FIG. 2, the P channel MOSFET P11 and the N channel MOSFET N12 are formed on the same semiconductor substrate 10 so as to each have a size substantially equal or similar to that of each of the P channel MOSFET P10 and the N channel MOSFET N10 of FIG. 1, respectively. In the present preferred embodiment, the size includes a gate length and a gate width, the similar size between the two MOSFET means that a ratio of the gate length to the gate width of one MOSFET is substantially equal to that of another MOSFET, and this will be applied hereinafter. In addition, the P channel MOSFET P12 and the N channel MOSFET N11 are formed on the same semiconductor substrate 10 so as to each have a size substantially equal or similar to that of each of the P channel MOSFET P10 and the N channel MOSFET N10 of FIG. 1, respectively.

When a reference current Iref corresponding to the operating current $I_O$ of FIG. 1 flows into the replica circuit 4 constituted as stated above, a bias current Vbop0 applied to the gate of the P channel MOSFET P11 and a bias voltage Vbn0 applied to the N channel MOSFET N11 are set to correspond to the reference current Iref. By applying the bias voltages Vbop0 and Vbn0 to the gate of the P channel MOSFET P10 and that of the N channel MOSFET N10 to be used as the bias voltages shown in FIG. 1, respectively, the operating current $I_o$ corresponding to the reference current Iref can be set thereto.

As described so far, the class AB CMOS output circuit 3 that supplies the bias voltages of the CMOS output circuit 3 of FIG. 1 from the replica circuit 4 can be constituted. The present invention exhibits unique function and advantageous effects that even the low voltage circuit that cannot implement any bias circuit by providing transistors of multiple stages can implement the class AB CMOS output circuit 3. In other words, the class AB CMOS output circuit 3 according to the present preferred embodiment operates at a power supply voltage equal to or lower than one volt, and the stationary current of the class AB CMOS output circuit 3 can be arbitrarily set from the external circuit.

In the present preferred embodiment described above, the switching MOSFETs P9 and N9 for turning on and off the class AB CMOS output circuit 3 are provided. However, the present invention is not limited to this, and the MOSFETs P9 and N9 may not necessarily provided.

In the present preferred embodiment described above, the level shifter circuit 2 is coupled to the CMOS output circuit 3 using the coupling capacitors C1 and C2. However, if it is unnecessary to separately set the bias voltages in the level shifter circuit 2, the coupling capacitors C1 and C2 may not be inserted.

Moreover, in the present preferred embodiment described above, the level shifter circuit 2 is provided. However, if it is unnecessary to change the signal level, the level shifter circuit 2 may not be inserted.

As stated so far in detail, the class AB CMOS output circuit 3 that supplies the bias voltages of the CMOS output circuit 3 of FIG. 1 from the replica circuit 4 can be constituted. The present invention exhibits unique function and advantageous effects that even the low voltage circuit that cannot implement the bias circuit by providing transistors of multiple stages can implement the class AB CMOS output circuit 3. In other words, the class AB CMOS output circuit 3 according to the present invention operates at a low power supply voltage of, for example, one volt or less, and the stationary current of the class AB CMOS output circuit 3 can be arbitrarily set from the external circuit.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A class AB CMOS output circuit comprising:
    a CMOS circuit formed on a semiconductor substrate, said CMOS circuit including a first P channel transistor and a first N channel transistor, said CMOS circuit operating by a predetermined operating current $I_o$,
    a replica circuit formed on said semiconductor substrate, said replica circuit including a second P channel transistor having a size equal or similar to that of said first P channel transistor, and a second N channel transistor having a size equal or similar to that of said first N channel transistor; and
    a bias voltage supply for allowing said second P channel transistor and said second N channel transistor of said replica circuit to operate based on a reference current Iref corresponding to said operating current $I_o$, for applying a first bias voltage as applied to a gate of said second P channel transistor to a gate of said first P channel transistor, and for applying a second bias voltage as applied to a gate of said second N channel transistor to a gate of said first N channel transistor.

2. The class AB CMOS output circuit as claimed in claim 1, further comprising:
    a third P channel transistor for operation switching inserted between said first P channel transistor and a power supply voltage Vdd; and a third N channel transistor for operation switching inserted between said first N channel transistor and a ground voltage Vss.

3. The class AB CMOS output circuit as claimed in claim 1, further comprising an operational amplifier circuit provided at a previous stage of said class AB CMOS output circuit.

4. The class AB CMOS output circuit as claimed in claim 2, further comprising an operational amplifier circuit provided at a previous stage of said class AB CMOS output circuit.

5. The class AB CMOS output circuit as claimed in claim 3, further comprising a level shifter circuit provided between said operational amplifier circuit and said class AB CMOS circuit.

6. The class AB CMOS output circuit as claimed in claim 4, further comprising a level shifter circuit provided between said operational amplifier circuit and said class AB CMOS circuit.

* * * * *